United States Patent
Hung et al.

(10) Patent No.: US 7,867,859 B1
(45) Date of Patent: Jan. 11, 2011

(54) GATE ELECTRODE WITH DEPLETION SUPPRESSION AND TUNABLE WORKFUNCTION

(75) Inventors: Steven Hung, San Francisco, CA (US); Judy L. Hoyt, Belmont, MA (US); James F. Gibbons, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 136 days.

(21) Appl. No.: 12/140,955

(22) Filed: Jun. 17, 2008

Related U.S. Application Data (62) Division of application No. 11/605,714, filed on Nov. 29, 2006, which is a division of application No. 10/450,476, filed on Jan. 16, 2004, now abandoned.

(51) Int. Cl.
*H01L 21/336* (2006.01)
*H01L 21/20* (2006.01)
*H01L 21/4763* (2006.01)
*H01L 21/3205* (2006.01)

(52) U.S. Cl. .................... 438/283; 438/284; 438/303; 438/584; 438/586; 438/592

(58) Field of Classification Search ............. 438/283, 438/284, 303, 584, 586, 592
See application file for complete search history.

(56) References Cited

U.S. PATENT DOCUMENTS

| | | | |
|---|---|---|---|
| 6,028,339 A | 2/2000 | Frenette et al. | |
| 6,091,120 A | 7/2000 | Yeom et al. | |
| 6,097,070 A | 8/2000 | Mandelman et al. | |
| 6,140,688 A | 10/2000 | Gardner et al. | |
| 6,232,189 B1 | 5/2001 | Yi et al. | |
| 6,373,111 B1 * | 4/2002 | Zheng et al. | 257/407 |
| 6,696,333 B1 | 2/2004 | Zheng et al. | |
| 6,790,731 B2 * | 9/2004 | Zheng et al. | 438/283 |
| 6,794,232 B2 | 9/2004 | Zheng et al. | |
| 6,879,009 B2 | 4/2005 | Zheng et al. | |
| 2005/0054149 A1 | 3/2005 | Xiang et al. | |

OTHER PUBLICATIONS

EE 4253/6253 Lecture Notes, Sep. 7, 1998, pp. 39-45.

* cited by examiner

*Primary Examiner*—Luan C Thai
(74) *Attorney, Agent, or Firm*—Crawford Maunu PLLC

(57) ABSTRACT

Semiconductor device performance is improved via a gate structure having a tunable effective workfunction and reduced gate depletion effects. According to an example embodiment, the design threshold voltage of a semiconductor device is adjusted in a manner that includes providing a gate having a workfunction that enables operation of the semiconductor device at a selected voltage. The gate is formed having two different conductive materials with different electric workfunctions that both significantly contribute to the overall workfunction of the gate. The relative composition, thickness, and arrangement of each of the two conductive materials is selected to attain a gate electrode workfunction that is different than the workfunctions of each of the two layers and that sets the threshold voltage of the semiconductor device. The adjustability of the effective workfunction of the gate electrode can be applied to a variety of semiconductor devices. The ability to reduce gate depletion effects also provides enhanced device current drive.

12 Claims, 5 Drawing Sheets

GATE ELECTRODE WITH DEPLETION SUPPRESSION AND TUNABLE WORKFUNCTION

RELATED PATENT DOCUMENTS

This is a divisional (or alternatively, a continuation) under 35 U.S.C. §120 of U.S. patent application Ser. No. 11/605,714 filed on Nov. 29, 2006, which is a divisional of U.S. patent application Ser. No. 10/450,476 filed on Jan. 16, 2004 now abandoned, which is the national stage entry under 35 U.S.C. 371 of International Application No. PCT/US2001/030926 filed on Oct. 2, 2001, which claims benefit under 35 U.S.C. §119(e) of U.S. Provisional Application Ser. No. 60/256,708 filed on Dec. 18, 2000; each of these patent documents is fully incorporated herein by reference.

FIELD OF THE INVENTION

The present invention relates generally to semiconductor devices having a gate structure whereby the thickness and structure of the gate electrode material are used to minimize gate depletion effects and to tune the gate workfunction, e.g., thereby setting a threshold voltage of a transistor.

BACKGROUND OF THE INVENTION

Recent technological advances in the semiconductor industry have permitted dramatic increases in circuit density and complexity, and commensurate decreases in power consumption and package sizes for integrated circuit devices. Single-chip microprocessors now include many millions of transistors operating at speeds of hundreds of millions of instructions per second to be packaged in relatively small, air-cooled semiconductor device packages. A byproduct of these technological advances has been an increased demand for semiconductor-based products, as well as increased demand for these products to be fast, reliable, flexible to manufacture and inexpensive. These and other demands have led to increased pressure to manufacture a large number of semiconductor devices at an efficient pace while increasing the complexity and improving the reliability of the devices.

One important semiconductor device component that affects the control and the performance of the device is the gate electrode. For example, polysilicon has long been used as the gate electrode of Metal Oxide Semiconductor (MOS) devices, such as MOS Field-Effect Transistors (MOSFETs). To increase the carrier concentration in the polysilicon electrode, polysilicon is typically doped very heavily to be either n-type or p-type. As a result of the high doping, the Fermi level (the average electron energy level) of the polysilicon is fixed at either the conduction or the valence band edge, and so the workfunction of polysilicon gate electrode is fixed as well.

The threshold voltage of a MOSFET having a gate electrode over a channel region is dependent upon the difference between the workfunctions of the gate electrode and the channel region. With a fixed workfunction for the gate material, the MOSFET threshold voltage is typically adjusted by choosing the dopant concentration in the silicon below the gate dielectric (e.g., in the channel region). To achieve this, a technique such as ion implantation is used to introduce a specific amount of dopant with desired depth profile in the channel region (this is sometimes referred to as the "threshold-adjustment implant"). However, the threshold-adjustment implant superimposes on top of another doping profile that is used to suppress current leakage (punch-through-suppression implant). The superposition of both doping profiles causes excess dopant to be situated within the channel region, and so degrades the mobility of carriers and reduces transistor speed. In addition, for MOSFET applications where the channel length would be scaled down to sub-70 nanometers (nm), it becomes very difficult to simultaneously optimize both the punch-through-suppression doping and the threshold-adjustment doping profiles. In addition, the discrete distribution of implanted dopants can cause large deviations in threshold voltage from device to device, for sub-70 nm channel lengths, which represents a fundamental limitation to the scaling of MOSFETs. One method of dealing with this problem is to reduce the doping in the channel. In this case, the gate workfunction may be used to adjust the MOSFET threshold voltage.

Polycrystalline silicon-germanium alloys have been suggested as an alternative gate material for workfunction adjustment. For such applications, however, the adjustment is possible only within a limited range, and is only applicable to p-MOSFETs. Furthermore, these alloys suffer from a drawback of manufacturing a gate electrode from a semiconductor (either polysilicon or poly-silicon-germanium); namely these gate electrodes have an electrical carrier concentration that is usually limited to the order of about $10^{20}$ cm$^{-3}$.

The limited carrier concentration in the gate electrode causes a reduction in carrier concentration (depletion) above the gate dielectric when sufficient gate voltage is applied. The depleted portion of the gate electrode behaves like a dielectric instead of a conductor, and therefore increases the overall dielectric thickness of the transistor. Consequently, gate capacitance is reduced, which in turn reduces the transistor's current drive and speed.

To resolve this issue, materials with higher carrier concentrations (e.g., metals) have been considered as alternatives to polysilicon or polycrystalline silicon-germanium, for the gate electrode. Implementations of such metal gate electrodes have been difficult due to the lack of availability of appropriate workfunction values and/or due to chemical instability. Thus, the use of metallic gate electrodes has been hindered.

This limitation and others discussed herein have been a challenge in the semiconductor industry.

SUMMARY OF THE INVENTION

Various aspects of the present invention are directed to a semiconductor device having a gate electrode that enables tuning of a threshold voltage, and a gate electrode that minimizes gate depletion effects. These and other aspects of the present invention are exemplified in a number of illustrated implementations and applications, some of which are summarized below.

In one example embodiment of the present invention, a structure is adapted to enable tuning of the effective workfunction of a gate electrode by adjusting the thickness (an independent property) of a lower layer of the gate electrode, when two selected materials are used to faun upper and lower layers in the gate electrode. Thus, desired device properties including low gate carrier depletion, low gate resistivity, proper effective gate workfunction, and appropriate channel region doping and composition can be optimized simultaneously, thereby enabling higher performance MOSFETs.

According to a more particular example embodiment of the present invention, a semiconductor device structure is manufactured with a gate electrode that consists of a thin lower layer and a thicker upper layer. The respective workfunctions of the two layers are chosen to be sufficiently different and the order of layers is arranged such that the carriers, either electrons or holes, will be injected toward the lower layer by the difference between the workfunctions of the two materials. The redistribution of carriers (e.g., electrons or holes) toward the lower layer will shift the effective workfunction of the composite gate electrode to a value that is between that of the bulk workfunctions of the lower and upper layer materials. In the case where the lower layer has a thickness of only a few atomic spacings, the resulting effective workfunction of the composite gate electrode will be closer to the value of the upper layer material. When the thickness of lower layer is increased, the effective workfunction of the composite gate electrode will shift toward to that of the lower layer material. By choosing the thickness of the lower layer, the effective workfunction of the composite gate electrode can be tuned to a value between the bulk workfunctions of the upper and lower layer materials. Specifically, the two materials are selected such that a sufficient workfunction difference exists between them, and two layers of the materials are ordered to achieve the workfunction. The action of carrier redistribution (either electrons or holes) toward the lower layer will also reduce gate depletion effects, thereby improving the device current drive.

In another example embodiment of the present invention, a semiconductor device having a gate electrode structure such as that described above is manufactured. A gate dielectric is formed over a semiconductor substrate. An effective gate workfunction is selected that causes operation of the device when a selected voltage is applied to the gate electrode. A first conductive material with a first selected thickness is formed over the gate dielectric and a second conductive material with a second selected thickness is formed over the first conductive material. The first and second conductive materials form the gate electrode structure. The composition and thickness of each of the first and second conductive materials are selected so the gate electrode structure exhibits, via the combination of the first and second conductive materials, the selected gate workfunction and gate depletion suppression.

In another example embodiment of the present invention, a system is adapted for manufacturing a semiconductor device having a gate electrode structure, such as that described above, over a gate dielectric. The manufacturing system includes a control mechanism adapted to provide an effective gate workfunction that causes operation of the manufactured semiconductor device when a selected voltage is applied to the gate electrode. A formation arrangement is adapted to form a first conductive material with a first selected thickness over the gate dielectric. Another formation arrangement is adapted to form, over the first conductive material, a second conductive material with a second selected thickness. Each formation arrangement is adapted to form the first and second conductive materials so that they make up the gate electrode structure. In addition, the control mechanism is adapted to control the formation of the layers so that the composition and thickness of each of the first and second conductive materials is selectively configured and arranged. Thereby the gate electrode structure exhibits, via the combination of the first and second conductive materials, the desired gate workfunction and gate depletion suppression.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention that follows in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and the invention has been found to be particularly suited for devices in the deep-sub-micron regime, such as MOS devices, thyristors and other structures including a gate electrode over an underlying substrate. While the present invention is not necessarily limited to such applications, various aspects of the invention may be appreciated through a discussion of various examples using this context.

According to an example embodiment of the present invention, a gate electrode having a tunable effective workfunction is formed in a semiconductor device. At least two conductive materials are used in a selected arrangement to form the gate electrode, and the arrangements are selected to achieve an effective gate workfunction that provides a selected threshold voltage for the device. The gate is adapted to be formed in one of a plurality of configurations, each configuration resulting in the gate having a distinct effective workfunction. The effective workfunction of the gate electrode is tunable (e.g., in the design stage) by adjusting the thickness of a lower electrode layer.

This approach can be applied in any modern transistor, and provides a significant degree of freedom in the design of semiconductor devices. Specifically, varying the effective gate workfunction (e.g., for manufacturing electrodes for use in different applications) permits the doping in the channel region under the gate dielectric to be independently adjusted (e.g., to optimize properties other than the threshold voltage of the device such as for punch-through suppression and threshold adjustment). The gate structure also facilitates the injection of extra carriers into a region above a gate dielectric, which can reduce the adverse effects of gate depletion. By reducing gate depletion, higher current drive and better transistor performance can be realized. In addition, the gate structure can be manufactured with a desired workfunction while attaining low gate resistivity; in one example application the gate resistivity is less than about 70 μΩ-cm, and in another example application the gate resistivity is less than about 100 μΩ-cm.

The threshold voltage of the semiconductor device is selected depending upon the particular application for the device. In one implementation, the thickness of the lower electrode layer is varied so that the transistor exhibits a selected threshold voltage (e.g., a threshold voltage that corresponds to and/or is exceeded by an operating voltage for the semiconductor device). In other implementations, characteristics such as the composition, order and arrangement of one or more of the conductive materials being used are varied to achieve a particular threshold voltage. Examples of materials that can be used for the present invention include n+ and p+ polysilicon, n+ and p+ polycrystalline silicon-germanium, aluminum, copper, tungsten, magnesium, platinum, nickel and polycarbon.

Figure 1A:
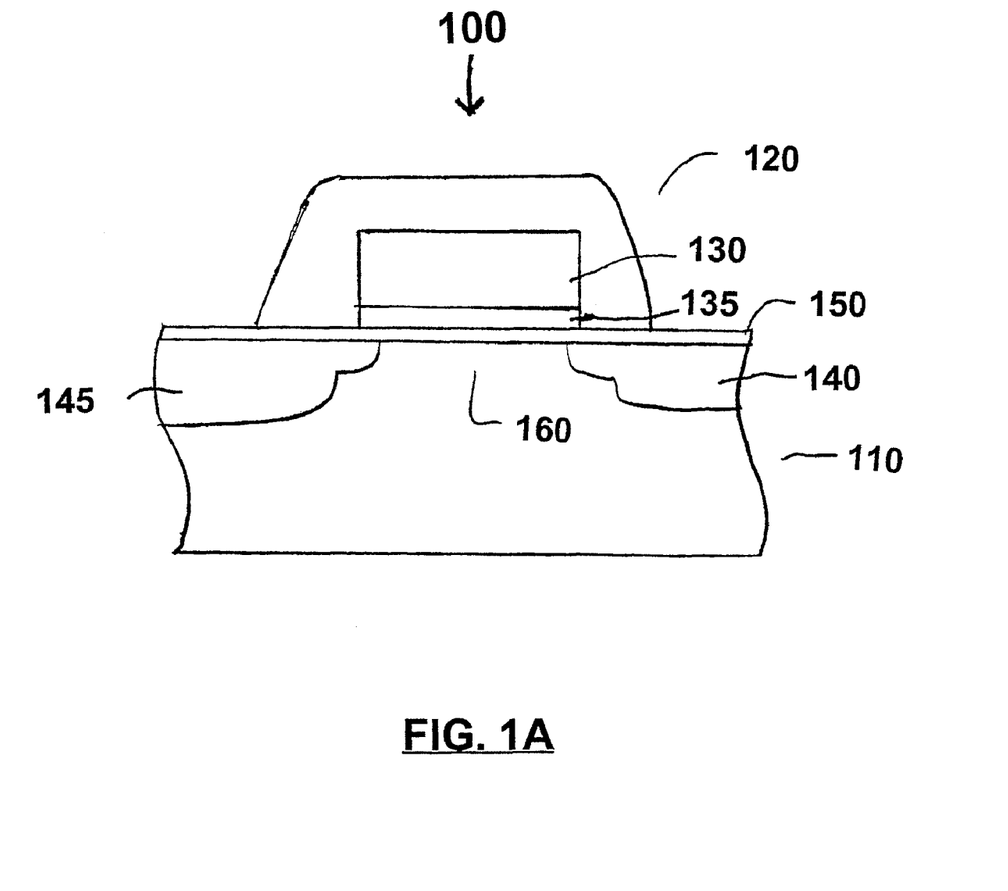
FIG. 1A is a semiconductor device structure having a gate electrode with an effective workfunction tuned according to an example embodiment of the present invention.

FIG. 1A shows a semiconductor device 100 having a transistor gate structure 120 including two conductive layers, according to a more particular example embodiment of the present invention. A bottom layer 135 is located over a gate dielectric 150 and channel region 160, and a top layer 130 is located over the bottom layer. The gate is formed over a substrate 110 having source/drain regions 140 and 145. The thickness of each respective layer in the gate is selected to fit the particular application. In one implementation, the thickness of the bottom layer is varied in the range of a few Angstroms (A) to 500 A. The thickness of the top layer is fixed at a value that can be much larger, for instance, 0.1 to 1 micron. As the thickness of the bottom layer is reduced to near zero, it becomes electrically transparent and the top layer dominates the workfunction of the gate (i.e., the contribution of the bottom layer becomes negligible); conversely, when the thickness of the bottom layer becomes too great, the bottom layer dominates the workfunction of the gate (i.e., the contribution of the top layer becomes negligible). In addition, as the bottom layer thickness is increased, the effective workfunction of the gate is affected thereby. As the thickness of the bottom layer is increased, its contribution to the gate workfunction increases. In this manner, adjusting the thickness of the bottom layer tunes the gate workfunction to values that are between those of each of the materials as used individually.

It has also been discovered that the relative order of layers in the multilayer gate electrode in FIG. 1A has a profound effect on the electrical behavior (gate depletion) of the transistor. In the case when electrons are dominant in the gate structure, an improper arrangement would be one when the top layer 130 has a larger workfunction value than the bottom layer 135. Electrons under such arrangement flow away from the bottom layer during the redistribution process, and consequently the bottom layer is somewhat depleted of electrons. This lack of electrons in the bottom layer gives rise to a gate depletion effect, a phenomenon that slows down the switching speed of the transistor. However, when the order of layers is reversed so that the top layer has a smaller workfunction value than the bottom layer, the electrons redistribute toward the bottom layer. This effectively renders the bottom layer more populated with electrons than it is in its natural state, and increases the current drive and speed of the transistor. Gate depletion in this case is reduced and sometimes even eliminated and at the same time, by adjusting the bottom layer thickness, the effective workfunction of the gate can be tuned between that of top and bottom layer materials. In the case where holes are the dominant carriers in the gate structure, a proper arrangement of the conductive layers includes the bottom layer having a smaller workfunction than the top layer (e.g., such that holes are redistributed toward the bottom layer).

Figure 1B:
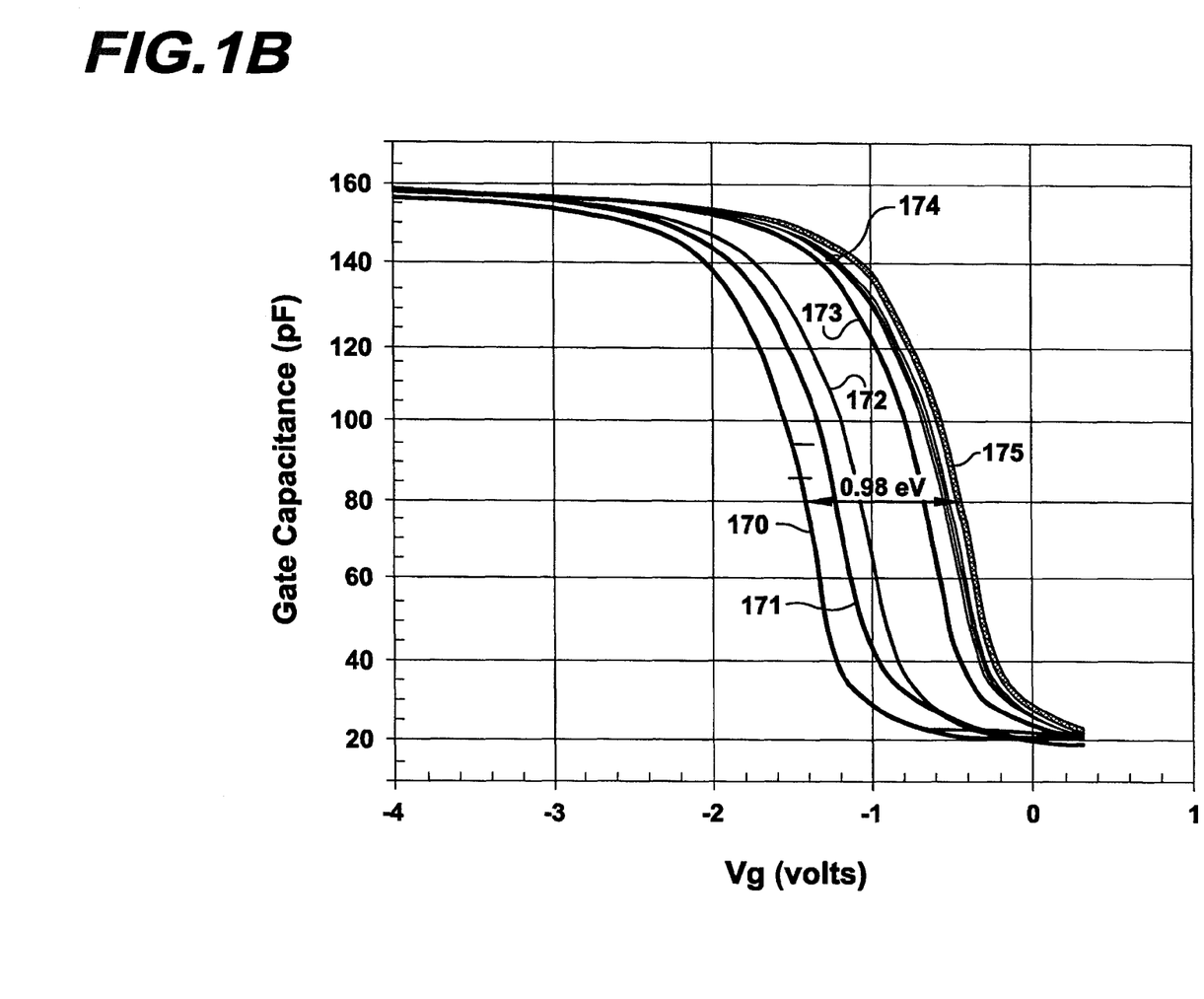
FIG. 1B is a diagram showing capacitance-voltage curves for aluminum over nickel gates, according to other example embodiments of the present invention.
Figure 1C:
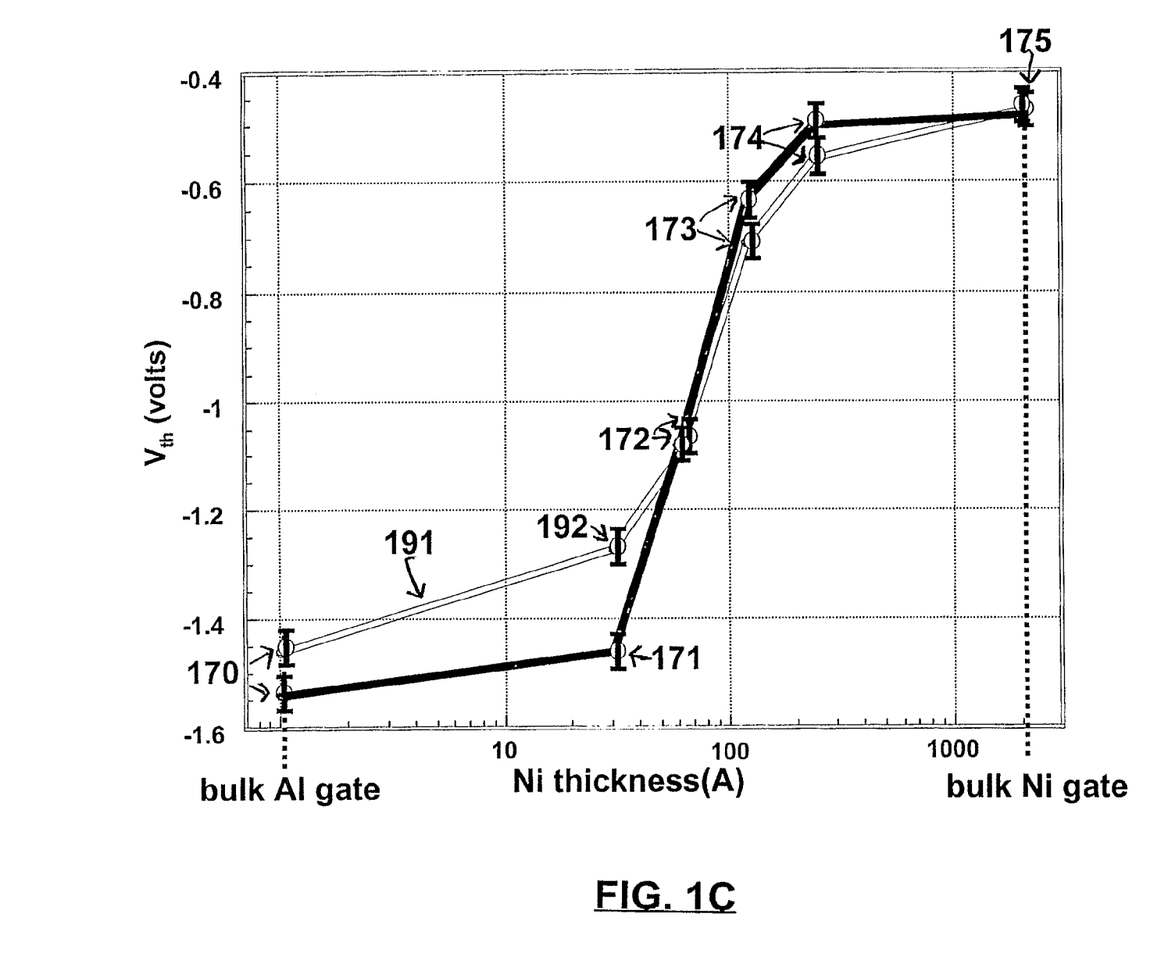
FIG. 1C is a diagram showing curves for threshold voltage of an aluminum over nickel gate using various dielectrics at selected thicknesses of nickel, according to other example embodiments of the present invention.

FIGS. 1B and 1C are graphs showing characteristics of various example gate electrodes, such as those similar to the electrode shown in FIG. 1A, having aluminum and nickel as respective top and bottom layers. FIG. 1B is a graph showing curves representing the workfunctions of a plurality of gate electrodes having aluminum over nickel at various nickel thicknesses, according to particular example embodiments of the present invention. The gate voltage ($V_g$) is the horizontal axis and the gate capacitance (pF) is the vertical axis. The curves shown represent gate electrodes formed over an oxide having a thickness of about 475 A. The example capacitance-voltage curves 170-175 represent gate electrodes having nickel thicknesses of about 0 A, 30 A, 60 A, 120 A, 240 A and 2000 A, respectively.

The thickness of the lower material can be selected to tune the gate electrode to achieve a selected design workfunction or, for a MOSFET application, a threshold voltage. In FIG. 1B, for instance, as the nickel thickness nears zero, the nickel becomes insignificant and the gate electrode workfunction is about that of a bulk aluminum gate, as represented by curve 170. As the nickel thickness exceeds 240 A, the nickel becomes so thick that the contribution of the aluminum to the gate electrode workfunction becomes insignificant and the gate electrode workfunction approaches the workfunction of a bulk nickel gate, as represented by curve 175. In most applications of the present invention, the workfunction provided using two electrode materials is selected to be substantially different than the workfunction for the device as implemented with either of the two electrode materials dominating the effective workfunction. In one application, the selected workfunction is different than the workfunctions represented by each of curves 170 and 175 in FIG. 1B by a selected percentage of the difference between these two curves for a given position on the curves (e.g., such as at a given gate capacitance or at given threshold voltage), preferably, in the respective linear ranges of gate capacitance versus threshold voltage as exemplified in FIG. 1B.

Various example embodiments implement respective substantial workfunction differences of between about 5% and 10%, between 10% and 15%, and at least 15% of the difference between the curves, for example, depending on the intended application and the desired gate capacitance, voltage threshold and/or controllability over the voltage threshold. Using the example of FIG. 1B, by selecting a nickel thickness that is between about 30 A and 240 A (corresponding to one of the above smaller percentage ranges), the workfunction of the gate electrode can be significantly changed, or tuned, from a single material electrode of either bulk nickel or bulk aluminum. Referring again to the example of FIG. 1A, the thickness of the bottom layer 135 (e.g., nickel) in a particular application is tuned during the design stage. The selected, or tuned, thickness is adapted to effect a gate electrode workfunction that, together with a workfunction of a substrate region below the electrode, effects a threshold voltage that results in a conductive channel forming in the substrate when a selected voltage is applied to the electrode.

FIG. 1C shows thickness in angstroms of a lower nickel portion of a gate electrode versus threshold voltage ($V_{th}$) of a semiconductor device, according to example embodiments of the present invention. Curve 191 represents a device having an oxide thickness of 475 A (e.g., as represented in FIG. 1B) and curve 192 represents a device having an oxide thickness of about 1300 A. In each instance, the thickness of the lower nickel layer is selected to achieve a workfunction that corresponds to a selected $V_{th}$ for a particular application. In this regard, various portions on the curves are labeled with reference numbers that correspond to the curves in FIG. 1B for gate electrodes having aluminum over nickel, the nickel having thicknesses of 0 A, 30 A, 60 A, 120 A, 240 A and 2000 A, respectively.

Figure 2:
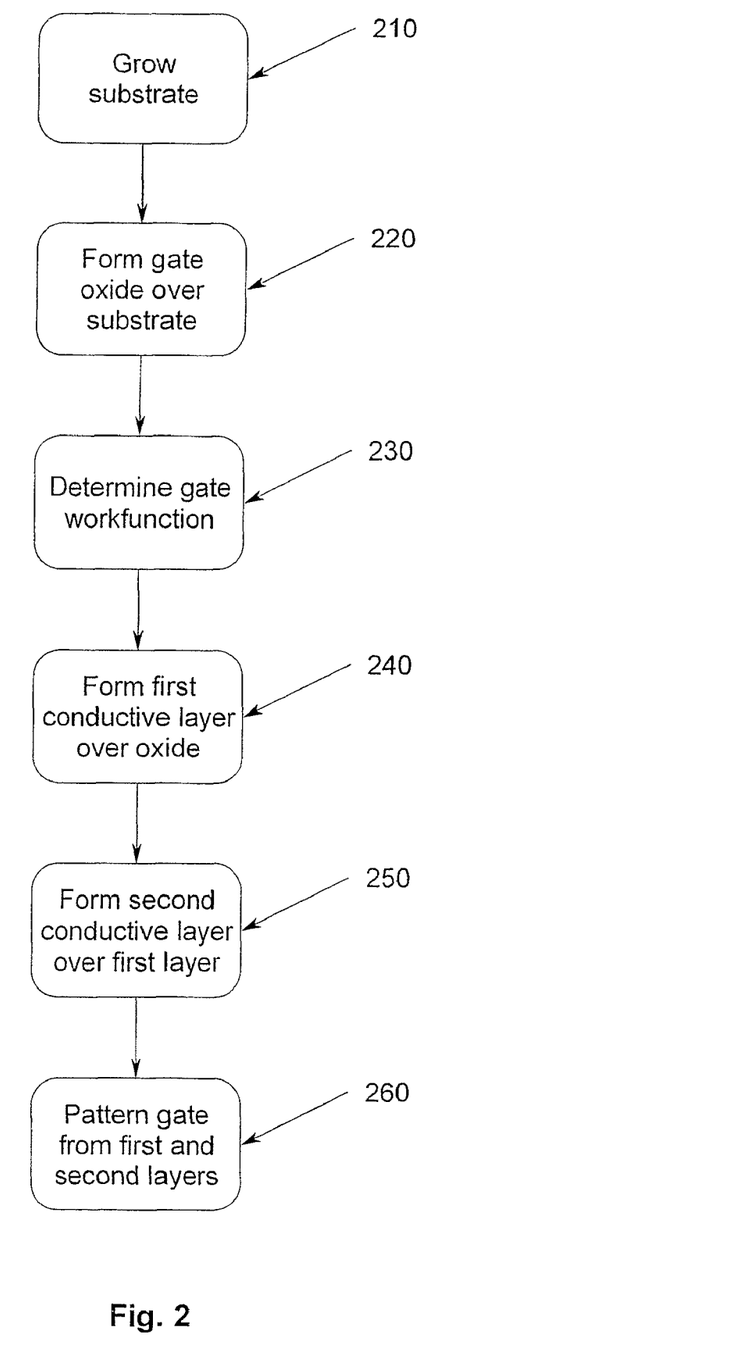
FIG. 2 is a flow diagram for manufacturing a semiconductor device, according to another example embodiment of the present invention.

FIG. 2 is a flow diagram for manufacturing a semiconductor device, according to another example embodiment of the present invention. A substrate is grown at block 210, and a gate dielectric is formed over the substrate at block 220. The gate dielectric, such as an oxide or any other dielectric material, is formed as a thin layer in a manner known to someone skilled in the art. The substrate includes a channel region over which a gate is to be formed. The composition and doping of the channel region, and the thickness and dielectric constant of the gate dielectric, are used to determine a selected gate workfunction at block 230. Specifically, the gate workfunction is selected to enable operation of the device when a selected voltage is applied to a gate over the channel region. Once the desired gate workfunction is determined, a first conductive layer is formed over the dielectric at block 240, and a second conductive layer is formed over the first layer at block 250. The thickness, arrangement and materials for the first and second layers are selected to achieve the determined gate workfunction, making the device operable when the selected voltage is applied to the gate. Finally, a gate is formed out of the first and second conductive layers using, for example, conventional gate patterning techniques, as depicted at block 260.

The formation of the first and second conductive layers at blocks 240 and 250, respectively, is effected in one or more of a variety of manners. In one particular example embodiment, material is deposited to form the first conductive layer using atomic layer deposition (ALD) to form the first conductive layer at block 240. In this implementation, reactive gases (e.g., deposition precursors) are introduced to a substrate in pulses, and the pulsed gases react to form the conductive layer. The duration of the pulses is selected such that the amount of material deposited forms a very thin layer, such as a layer having a thickness of about one atom of the deposited material. Various chemicals and deposition parameters, such as temperature and reactive gas flow rate, are applicable to various implementations of the present invention.

In another particular example embodiment, the first conductive layer is deposited at block 240 using molecular beam epitaxy (MBE). In this implementation, the substrate is placed in a chamber adapted to provide an ultra-high vacuum atmosphere and atoms of an element or compound for forming the first conductive layer are delivered to a substrate in the chamber. The chamber atmosphere is controlled such that the atoms arrive to the substrate without necessarily colliding with other atoms or molecules, which inhibits the formation of contaminants in the first conductive layer.

In another example embodiment of the present invention, polycarbon is used as one of the gate electrode materials. The polycarbon is particularly useful because its workfunction can also be adjusted in a typical chamber, such as a CVD or other deposition chamber. For instance, in one implementation, $BCl_3$ is introduced into the chamber at a flowrate of between about 10 and 100 sccm to achieve a workfunction adjustment of the polycarbon of about 0.3 eV. In another implementation, $H_2$ is introduced into the chamber at a flow-rate of between about 0 and 40 sccm to achieve a workfunction adjustment of the polycarbon of about 0.3 eV.

The gate dielectric is heated in a manner that facilitates the distribution of arriving atoms evenly across the surface to form an almost perfect crystal structure. The atoms used to make the first conductive layer are obtained via one or more evaporation furnaces, such as an effusion cell, which are controlled via temperature in the furnace and shutters adapted to control (e.g., block) the flux of atoms of an element to the substrate. The element or compound supplied via the evaporation furnace is directed to the substrate in a molecular beam and forms the conductive layer. The shutters and temperature are adaptable for achieving a deposition of almost any material composition and/or doping, and are capable for forming a layer having a thickness as small as about one atomic layer.

In another example embodiment of the present invention, a plurality of multilayer gates are used in a semiconductor die having two or more different device configurations. Each gate is formed having the first and second conductive layers that are formed having a composition and arrangement that effects a gate workfunction that causes the device to turn on when a selected threshold voltage is applied to the gate. Each of two different devices having different configurations is designed having different workfunctions to cause threshold operation at the same threshold voltage as the other device. This is particularly useful for achieving different gate workfunctions on a die to enable the formation of complementary devices on the die, such as complementary MOSFET (CMOS), which includes both n-type and p-type devices.

In a more particular example embodiment of the present invention, and also directed to the above multilayer gate approach, a high mobility material, such as strained silicon formed on relaxed silicon germanium (SiGe), is formed in the channel region of a transistor, such as a n-MOSFET. When conventional gate materials are used, a strained Si/relaxed SiGe n-MOSFET tends to have low threshold voltage compared to a conventional silicon MOSFET, due to characteristics such as the offset in the electronic band alignment. For instance, the threshold voltage of a strained Si/relaxed SiGe n-MOSFET may exhibit a threshold that is in the range of 0.01 to 0.3 Volts lower than that of a conventional silicon MOSFET. In this embodiment, a multilayer gate is formed over the channel of the transistor and is used to tune the threshold of the strained Si/relaxed SiGe transistor in a manner that increases the threshold voltage at which the transistor operates.

Conductive materials used in the gate are selected to achieve an effective gate workfunction that causes the high mobility material to reach its operating threshold when the gate is exposed to a selected threshold voltage that is higher than the low threshold voltage associated with conventional gate structures. In this manner, the low voltage threshold typically observed for such devices is raised. Thus, additional dopants do not have to be added to the channel of such devices. In addition, the applicability of the device to circuits requiring a threshold voltage higher than that exhibited with a conventional gate is improved.

In another example embodiment of the present invention, the multilayer gate is adapted to reduce or even eliminate the gate depletion effect exhibited in deep sub-micron devices. The intense electric field within the deep sub micron devices has the tendency to repel carriers away from the gate dielectric, which causes the gate depletion effect in devices with conventional gate materials, such as heavily doped polysilicon and polycrystalline silicon-germanium, where carrier concentrations are typically limited to the range of $10^{20}$ cm$^{-3}$. In certain embodiments of the present invention, differences between top and bottom layers of the multilayer gate are used to artificially redistribute carriers toward the bottom layer. The redistribution process causes the bottom layer to be more populated with carriers than it in is in its natural state, thereby minimizing the gate depletion effect presently observed for conventional gate electrodes.

In one particular implementation with low gate resistivity, the top and bottom conductive layers are selected to exhibit a carrier concentration of at least about 5e20 $cm^{-3}$. Example materials that may be used in connection with this example embodiment include aluminum, titanium, cobalt, tungsten nickel gold and other transitional elements, as well as semi-metallic materials such as polycrystalline carbon. The type, thickness and ordering of the layers is selected to achieve a different carrier concentration and dielectric constant between the two layers. In another implementation, when electrons are the dominant carriers in the gate structure, the upper conductive layer is formed having a smaller workfunction than the bottom layer, so electrons are redistributed toward the bottom layer. In another implementation, when holes are the dominant carriers in the gate structure, the upper conductive layer is foamed having a larger workfunction than the bottom layer, so holes are redistributed toward the bottom layer. In this manner, depletion effects are reduced or even eliminated, and transistor performance is improved relative to the case of a conventional gate structure.

In another example embodiment of the present invention, the multilayer gate is used in a nano-scale device such as a MOSFET having a very thin (e.g., less than or on the order of 10 nanometers) silicon body formed on top of an insulating substrate. Devices with this structure are typically referred to as ultra thin body silicon on insulator (ultra thin SOI). Such devices may, for example, include silicon MOSFETs scaled to a very small size. Because of the lightly-doped-channel of such thin-body nano-scale devices, the intrinsic variation in threshold voltage associated with the discrete number and placement of dopant atoms in the channel is reduced. The multilayer gate structure discussed herein provides a way to adjust (e.g., manufacture for a particular application) the threshold voltage of such a device while reducing gate depletion effects, and while reducing channel random doping fluctuation effects.

In another example embodiment of the present invention, the multilayer gate structure is adapted to improve the performance of silicon MOSFETs at low temperatures (e.g., below room temperature). In this example embodiment, a multilayer gate electrode is formed over the channel of the transistor and is used to tune the threshold of the transistor for operation at a desired temperature below room temperature, while simultaneously providing the desired threshold voltage for circuit operation. The multilayer gate electrode is adapted to provide the tuned threshold of the transistor in a manner that enables the reduction of the operating temperature of the transistor, improving the performance of the transistor and the circuit. In one particular instance, the multilayer gate electrode is further adapted to provide the desired threshold voltage at a given operating temperature of the device. In this manner, the desired threshold voltage is obtained without necessarily adjusting the doping in the region below the gate.

One common practice in the manufacture of semiconductor devices is the implantation of a species into the channel region of a transistor. Such implantation serves a variety of purposes in the current generation of transistors, including adjusting the threshold voltage so that the transistor can turn on or off at the desired voltage setting. Another purpose for implanting the channel is to control the potential in the substrate beneath the gate, to avoid leakage currents (e.g., punch-through). This implant is commonly referred to as the punch-through-stop implant, or super-steep retrograde profile. Another example embodiment of the present invention addresses this issue; the multilayer gate is adapted to effect control of the threshold voltage, thereby reducing or eliminating the threshold implant; e.g., in one application, this effect is realized without altering the typically-used dopant level in the underlying substrate; and in another application, this effect includes also adjusting the underlying dopant to provide a threshold voltage that is dependent upon the workfunction difference between the gate electrode and the substrate. In this manner, the punch-through implant can be better optimized, as effects of the threshold implant upon the punch-through implant are reduced or even eliminated. In addition, damage that can occur during the threshold-adjust implant is avoided. The multilayer gate is adapted to achieve the selected threshold in a manner such as described hereinabove.

In another example embodiment of the present invention, the multilayer gate is adapted to improve carrier mobility in the channel region below the gate. The enhanced carrier mobility is achieved by reducing the implant dose into the channel region that would be otherwise necessary for threshold implantation, absent the multilayer gate. The reduction in channel doping reduces the number of collisions that carriers would make with the implanted dopant. This increases the current drive and improves the overall transistor performance.

Figure 3:
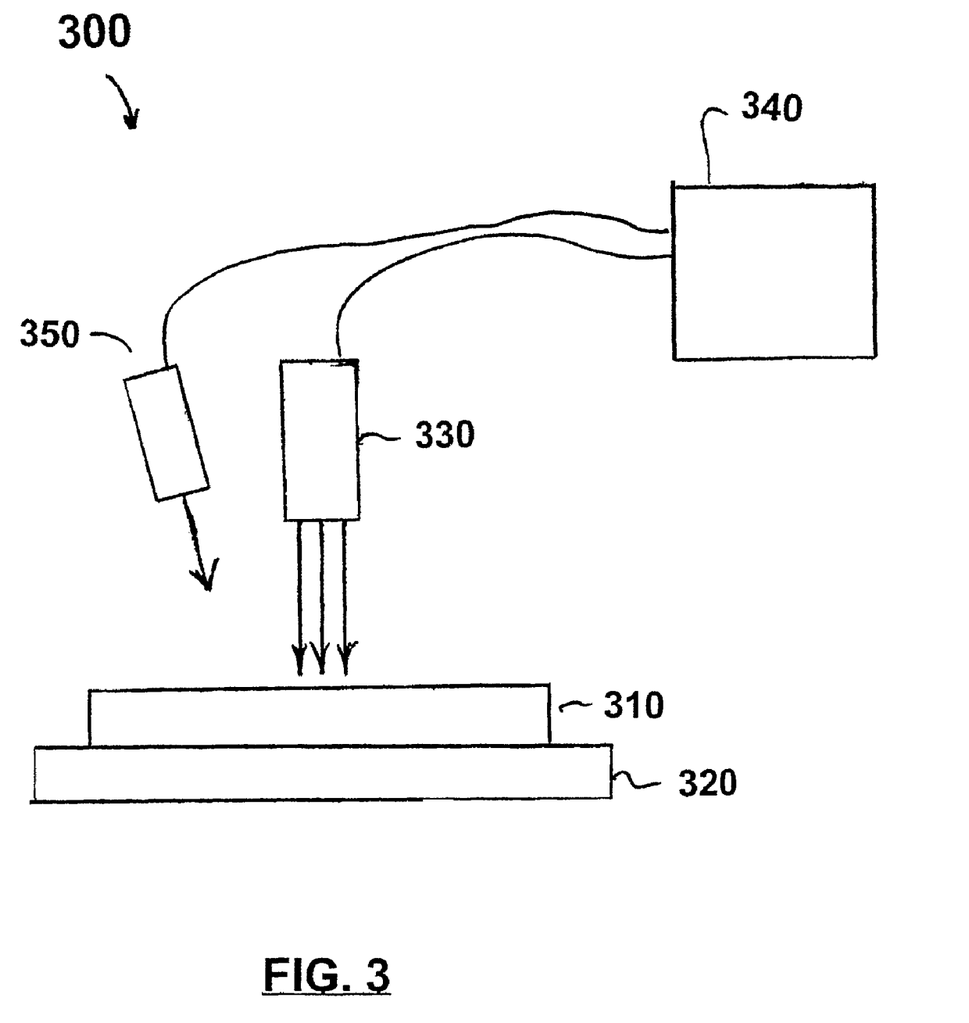
FIG. 3 is a system for manufacturing a semiconductor device having a tunable gate, according to another example embodiment of the present invention.

FIG. 3 shows a system for manufacturing a semiconductor device, according to yet another example embodiment of the present invention. The system includes a stage 320 for holding a wafer 310 for undergoing processing, including the heating and oxidation of the die to form a gate dielectric over die substrate. A deposition arrangement 330 is adapted to deposit first and second gate layers on the die with sufficient layer thickness control. The deposition arrangement may include one or more arrangements, such as a chemical vapor deposition (CVD), plasma-enhanced CVD (PECVD), electron beam evaporation, plasma sputtering deposition, physical vapor deposition (PVD), atomic layer deposition (ALD) or molecular beam epitaxy (MBE) arrangement.

In one implementation, the deposition arrangement is adapted to achieve a first layer thickness, of less than about 20 Angstroms, and in another implementation the deposition arrangement is adapted to achieve a deposited layer thickness of less than about 5 angstroms. The deposition arrangement is further adapted to provide a second layer thickness that is different from the first layer thickness, and in one particular application, is adapted to form a second layer having a much larger thickness (e.g., about 1 micron) than the first layer. As discussed above in connection with various example embodiments and their intended applications, the ability to achieve the desired gate capacitance, voltage threshold and/or controllability over the voltage threshold, can depend upon the preciseness of the equipment used in the manufacture of the gate electrode, particularly its first (lower) layer. For example, one of the above discussed ranges of percentages may be desirable merely because of limitations, practicable or otherwise, of the deposition equipment.

An etching arrangement 350, such as a FIB or laser etching arrangement, is adapted to pattern a gate from the deposited gate layers. The deposition and etching arrangements are further adapted to deposit and etch the gate layers to form a patterned gate in a manner that effects a selected gate workfunction resulting from the composition and arrangement of the two layers. Controller 340 is adapted to control the deposition arrangement 330 and the etching arrangement 350 to effect the selected gate workfunction. In one implementation, the etching arrangement is adapted to etch the first gate layer prior to the second gate layer being formed.

In another implementation, the controller 340 is a programmable microcomputer that resides within the control unit for a deposition tool and is adapted for manufacturing a semiconductor device having a gate electrode workfunction defined by the first and second layers. The workfunction is selected to meet a variety of implementations. In one particular instance, the microcomputer is adapted to set the thickness of each of the first and second layers in response to known inputs including, for example, gate dielectric characteristics, threshold voltage characteristics and characteristics of the substrate.

In each of the above example embodiments, a variety of equipment types can be adapted to form a gate having a particular workfunction. Deposition arrangements, etching arrangements and controllers that can be adapted for use in connection with FIG. 3 and other aspects of the present invention are commercially available, such as those available from Applied Materials, Inc., of Santa Clara, Calif. and from Silicon Valley Group of San Jose, Calif. Although not necessarily used in the past to achieve similar results, these commercially available equipment types can be adapted to form a gate electrode having upper and lower layers that both influence the gate workfunction, such as having a lower electrode layer thickness that achieves a selected threshold voltage. In other implementations, commercially available equipment is adapted to form the gate electrode having characteristics such as the composition, order and arrangement of one or more of the conductive materials that are selected to achieve a particular threshold voltage.

While the present invention has been described with reference to several particular example embodiments, those skilled in the art will recognize that many changes may be made thereto. For example, various alternative and/or more specific implementations consistent with the present invention are discussed in the Appendix filed in the priority case (entitled "Exploration of Novel Gate Materials and Structures for MOS Applications" by the inventors of the instant application), incorporated by reference in its entirety. Such changes and implementations do not depart from the spirit and scope of the present invention, which is set forth in the following claims.

What is claimed is:

1. A method of forming a channel region in a semiconductor device, the method comprising:
   selecting composition and doping characteristics of a field-effect transistor channel region relative to a desired implementation of the semiconductor device;
   forming the channel region with the selected composition and doping; and
   as a function of the selected composition and doping characteristics of the channel region, providing in the semiconductor device and adjacent the channel region, an electrode including first and second conductive materials to effect a redistribution of carriers from the second conductive material into the first conductive material in response to a voltage applied at the electrode to create an inversion layer in the channel region.

2. A method of setting the workfunction of a capacitive semiconductor device during the manufacture thereof, the method comprising:
   selecting lower and upper conductive materials having different respective workfunctions;
   independently selecting a thickness and arrangement of the lower conductive material, relative to the upper conductive material, for effecting a redistribution of carriers between the conductive materials to set the workfunction of an electrode formed using the conductive materials;
   arranging the conductive materials adjacent to one another with the lower conductive material having said selected thickness and arrangement, to form the electrode with a workfunction that has been set according to said thickness and arrangement, the electrode workfunction being between the respective workfunctions of the lower and upper conductive materials.

3. A method of setting the workfunction of an electrode to be implemented in a semiconductor device, the method comprising:
   determining an electrode workfunction as a function of at least one of a composition of an underlying channel region, a composition of an underlying dielectric material, and a desired threshold voltage of the semiconductor device;
   selecting a thickness of a lower conductive layer of a composite electrode having the lower conductive layer and an upper conductive layer adjacent thereto for achieving the determined workfunction; and
   providing an electrode having the lower and upper conductive layers, the lower conductive layer having said selected thickness, the conductive layers being arranged to effect a redistribution of carriers from the second conductive material into the first conductive material in response to a threshold voltage applied at the electrode.

4. The method of claim 3, wherein determining an electrode workfunction includes determining a workfunction for an electrode of a field-effect transistor that will effect an inversion region in a particular underlying channel region in response to a particular threshold voltage being applied to the electrode.

5. The method of claim 3, wherein
   the steps of determining, selecting and providing are carried out for electrodes of different field-effect transistors having different workfunctions, with the lower conductive layers being of the same composition for each of the different electrodes, and the upper conductive layers being of the same composition in each of the different electrodes,
   the step of providing, for one of the electrodes, includes providing a lower conductive layer having a thickness that is selected in response to the composition of an underlying channel region and that is different from a thickness of a lower conductive layer for a different one of the electrodes, and
   each electrode effects an inversion layer in an underlying channel region in response to a common threshold voltage applied to each electrode.

6. The method of claim 1, wherein providing an electrode including first and second conductive materials includes providing a conductive integrated material having a lower region as the first material, an upper region as the second material and an interfacing region between the lower and upper regions, and arranging the lower, upper and interfacing regions to, when implemented as a composite electrode with voltage applied thereto, redistribute carriers through the interface from the upper region into the lower region to effect an electrode workfunction that is significantly different than respective bulk workfunctions of the lower and upper regions.

7. In a semiconductor device, a method for processing carriers, the method comprising the steps of:
   providing in the semiconductor device a gate electrode including first and second conductive materials to effect a redistribution of carriers from the second conductive material into the first conductive material in response to a voltage applied at the gate electrode; and applying a voltage at the gate electrode and, in response thereto, causing the gate electrode to exhibit an effective workfunction that is significantly different than the workfunction of either the first conductive material or of the second conductive material.

8. The method of claim 7, wherein the voltage applied at the gate electrode is at least as great as the threshold voltage.

9. In a semiconductor device, a method for processing carriers, the method comprising the steps of:

providing, over a channel region connecting electrodes in the semiconductor device, a gate electrode including first and second conductive materials to effect a redistribution of carriers from the second conductive material into the first conductive material in response to a voltage applied at the gate electrode, based on composition and doping characteristics of the channel region; and applying a voltage at the gate electrode and, in response thereto, causing the gate electrode to exhibit an effective workfunction that is significantly different than the workfunction of either the first conductive material or of the second conductive material.

10. The method of claim 9, wherein the voltage applied at the gate electrode is at least as great as the threshold voltage and sufficient to create an inversion layer in the channel region.

11. A deposition tool for manufacturing a semiconductor device having an electrode workfunction that is defined by lower and upper layers of conductive material, the electrode workfunction being significantly different from respective workfunctions of the lower and upper layers, the deposition tool comprising:

a control unit having a programmable microcomputer that is programmed to set the thickness of the lower layer of the electrode in response to known inputs for the electrode including at least one of electrode dielectric characteristics, threshold voltage characteristics and characteristics of a channel region underlying the electrode; and a deposition arrangement controlled by the control unit to form the lower layer at the set thickness.

12. The method of claim 1, wherein providing an electrode including first and second conductive materials includes using a deposition tool having a deposition arrangement and control unit, the control unit having a programmable microcomputer, by programming the microcomputer to set the respective thicknesses of the first and second conductive materials in response to known inputs for the semiconductor device including at least one of characteristics of a dielectric between the electrode and the channel region, threshold voltage characteristics of the electrode, and characteristics of the channel region underlying the electrode; and using the control unit to control the deposition arrangement to form the first and second conductive materials at the respective thicknesses to effect a redistribution of carriers from the second conductive material into the first conductive material in response to a voltage applied at the electrode to create an inversion layer in the channel region.

* * * * *